(12) United States Patent
Huang

(10) Patent No.: US 6,296,507 B1
(45) Date of Patent: Oct. 2, 2001

(54) ELECTRICAL SOCKET

(75) Inventor: Yao-Chi Huang, Yung-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/507,223

(22) Filed: Feb. 18, 2000

(30) Foreign Application Priority Data

Jan. 28, 2000 (TW) ................................................ 89201592

(51) Int. Cl.[7] .................................................. H01R 13/625
(52) U.S. Cl. .............................................................. 439/342
(58) Field of Search ............................. 439/342, 259–270

(56) References Cited

U.S. PATENT DOCUMENTS

| | | | |
|---|---|---|---|
| 4,420,205 | * 12/1983 | McHugh et al. | 439/342 |
| 4,538,870 | * 9/1985 | Thewlis | 439/342 |
| 5,707,247 | * 1/1998 | Konstad | 439/342 |
| 5,855,489 | * 1/1999 | Walker | 439/342 |
| 6,071,140 | * 6/2000 | McHugh et al. | 439/342 |

* cited by examiner

*Primary Examiner*—Gary F. Paumen
(74) *Attorney, Agent, or Firm*—Wei Te Chung

(57) ABSTRACT

A ZIF PGA mobile socket of the present invention comprises a base, a cover slidably mounted on the base, a plurality of electrical contacts mounted in the base, a metallic ring, and a cam actuator partially received in the ring. The metallic ring is insert molded in the cover and has an angular outer contour to enhance the retention of the metallic ring with the cover. The cam actuator of the socket rotates in the metallic ring when driven by an externally-applied force, thereby driving the cover to slide along the base, opening and closing the engagement between the pins of a chip mounted on the cover and the contacts mounted in the base.

1 Claim, 5 Drawing Sheets

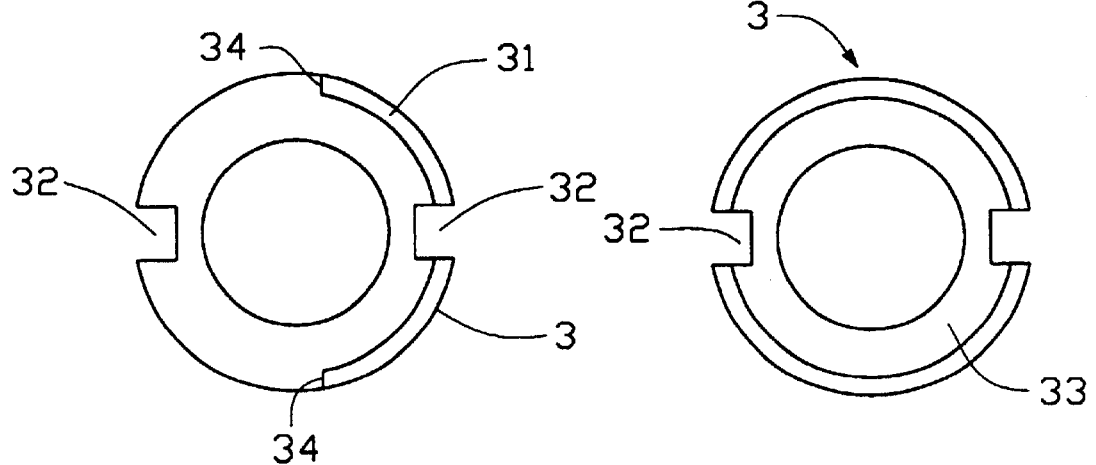
FIG. 3
FIG. 5
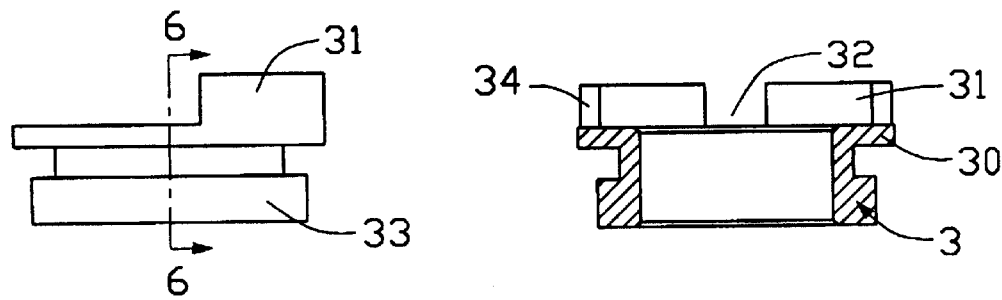
FIG. 4
FIG. 6

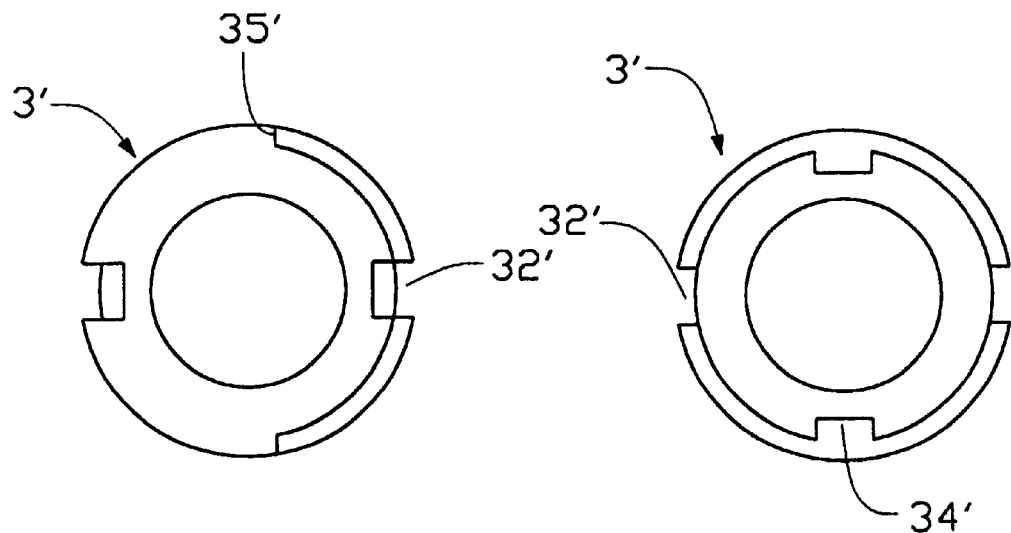
FIG. 7
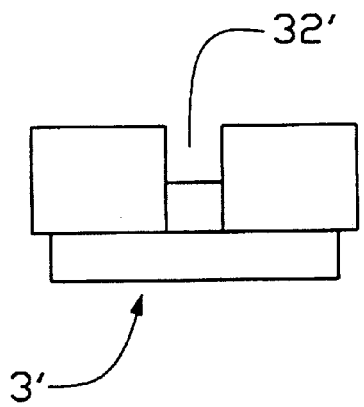
FIG. 9
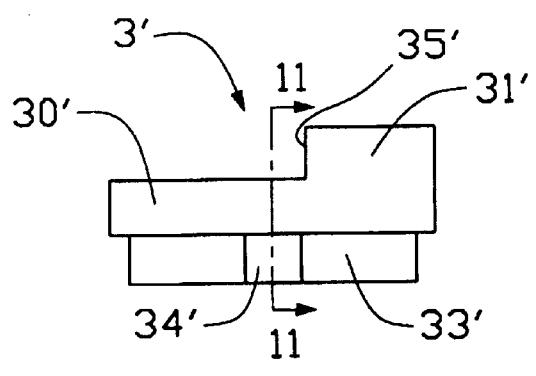
FIG. 8
FIG. 10

ELECTRICAL SOCKET

BACKGROUND OF THE INVENTION

1. Field of the Invention

The present invention relates to an electrical socket, and particularly to a ZIF (Zero Insertion Force) mobile socket for use with a PGA (Pin Grid Array) chip.

2. Description of the Prior Art

A ZIF socket is often used to mount a PGA chip onto a printed circuit board (PCB). One example of such connectors comprises a base, a cover mounted onto the base, a plurality of electrical contacts received in the base, and an actuation mechanism including a plastic ring and a metallic cam actuator. The cover is actuated to slide on the base by rotation of the metallic cam actuator in the plastic ring, thereby causing the pins of the PGA chip mounted on the cover to engage with/disengage from the contacts in the base. The ring is assembled in the cover of the socket by loosely fitting, interferentially fitting, or by being adhesively bound into a hole in the cover. The connection between the ring and the cover is easily broken during operation of the socket, thereby causing malfunction of the socket. Further, the plastic ring is apt to be worn out by the rotation of the metallic cam actuator therein, resulting in a shortened life thereof, and in turn a shortened life of the socket.

Therefore, an improved ring is desired to overcome the disadvantages of the prior art.

SUMMARY OF THE INVENTION

The major object of the present invention is to provide a ZIF PGA socket having a ring which has a reliable connection with the cover of the socket and has a lengthened life.

An electrical socket in accordance with the present invention comprises a base, a cover slidably mounted onto the base, a metallic ring insert molded in the cover, a cam actuator partially received in the ring, a plurality of electrical contacts received in the base, and a washer. The base comprises a first flange located at a corner thereof, the first flange defining an elongated square hole extending through the base. A plurality of passageways is defined in the base, each passageway accommodating one of the electrical contacts. The cover defines a plurality of passages corresponding to the passageways of the base into which pins of a PGA package mounted on the cover fit. The cover also forms a corresponding second flange which cooperates with the first flange, and the second flange defines an aperture therethrough in alignment with the elongated square hole of the base. The metallic ring includes a smooth, annular inner surface for engaging with the cam actuator, and an angular outer contour allowing it to provide a more reliable retention within the aperture after being insert molded in the aperture of the second flange. The metallic ring comprises an upper circular stop wall, a support portion, and a bottom portion. The cam actuator comprises an upper disk, a lower disk and a lower cam block. The coincident rotation axes of the upper disk and lower disk are offset from the rotation axis of the lower cam block. The lower disk is received in the ring while the upper disk is supported by the support portion of the ring. The cam block of the cam actuator extends through the elongated square hole of the first flange and comprises a riveting end which is riveted to the base by the washer. The cam actuator rotates in the ring when an external torsional force is exerted thereon, such as that provided by a tool fitted into an elongated groove defined in the top of the upper disk. Rotation of the cam actuator causes the cover to slide on the base, mating or unmating pins of a PGA package on the cover with the contacts of the base.

Other objects, advantages and novel features of the invention will become more apparent from the following detailed description of the present embodiment when taken in conjunction with the accompanying drawings.

BRIEF DESCRIPTION OF THE DRAWINGS

FIG. 3 is a top plan view of a ring of the socket of FIG. 1 according to a first embodiment of the present invention;

FIG. 4 is a side elevation view of FIG. 3;

FIG. 5 is bottom plan view of FIG. 3;

FIG. 6 is a cross sectional view taken from line 6—6 of FIG. 4;

FIG. 7 is a top plan view of a ring according to a second embodiment of the present invention;

FIG. 8 is a side elevation view of FIG. 7;

FIG. 9 is a bottom plan view of FIG. 7;

FIG. 10 is a view similar to FIG. 8 but taken from a different aspect; and

DETAILED DESCRIPTION OF THE INVENTION

Figure 1:
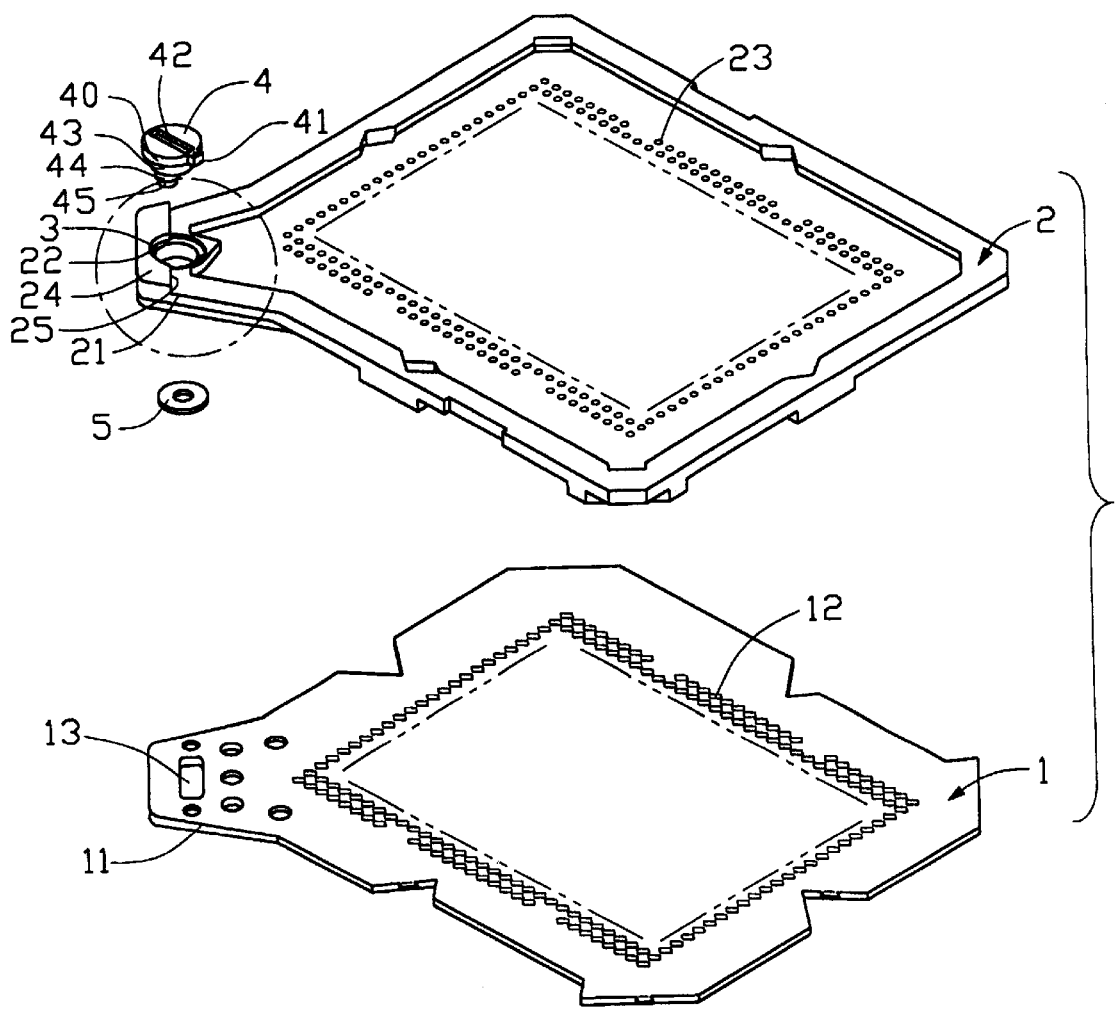
FIG. 1 is an exploded view of a ZIF PGA socket in accordance with the present invention.
Figure 2:
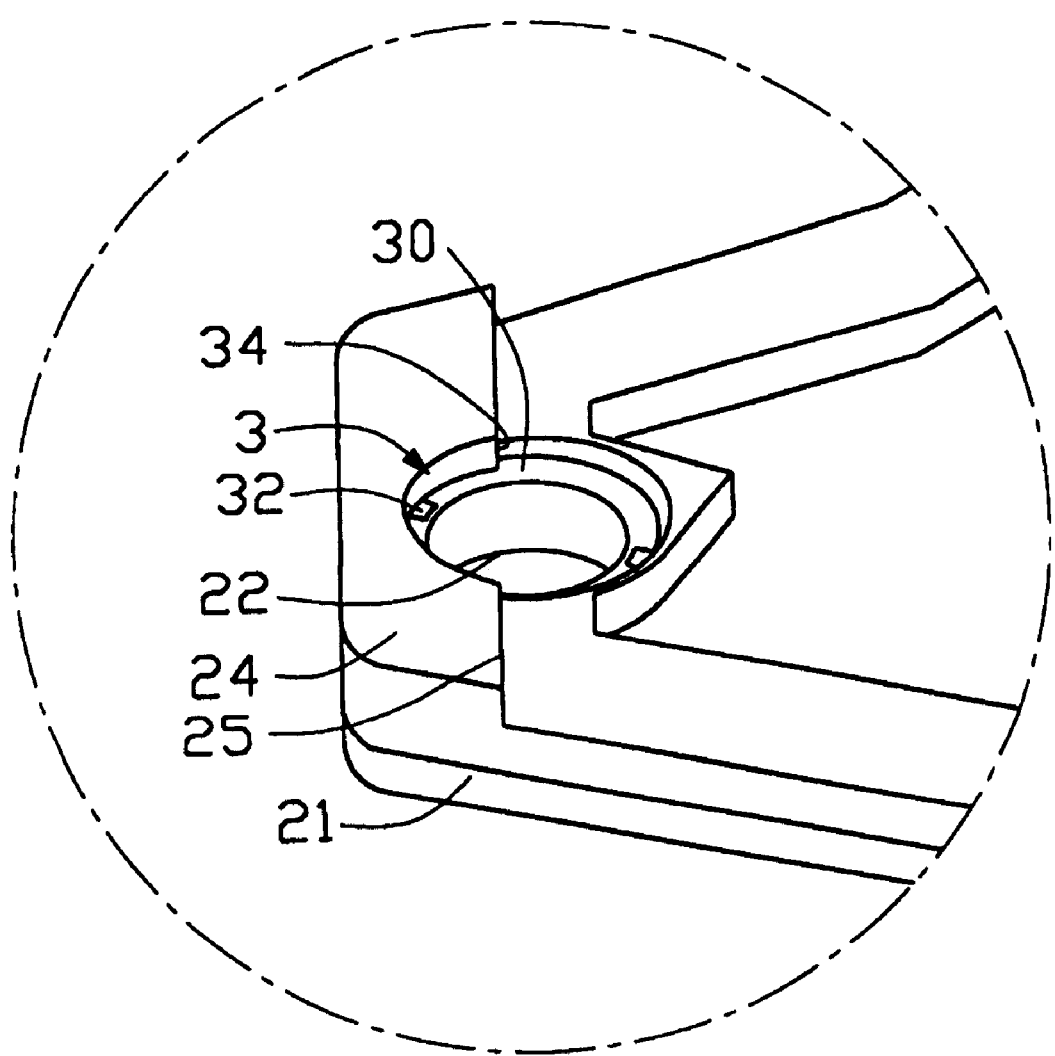
FIG. 2 is a partial enlarged view of FIG. 1.
Figure 11:
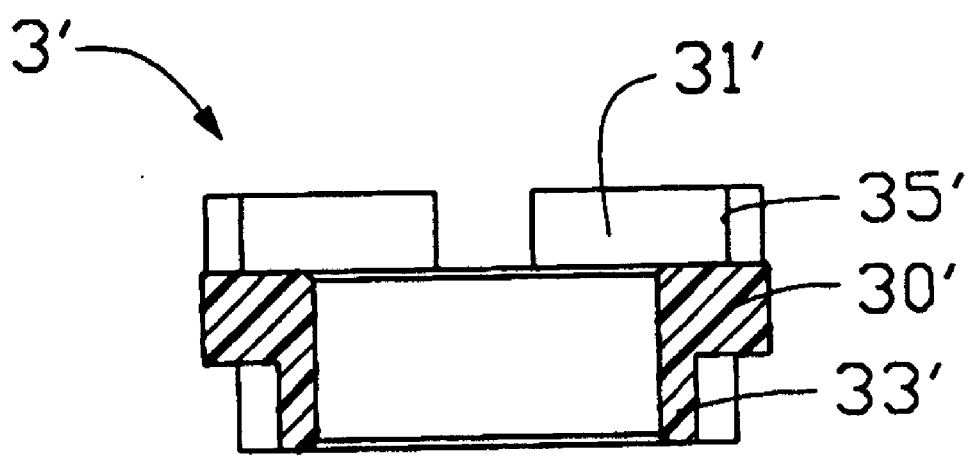
FIG. 11 is a cross sectional view taken from line 11—11 of FIG. 8.

Referring to FIGS. 1 and 2, an electrical mobile socket connector in accordance with the present invention comprises an insulative base 1, a dielectric cover 2, a metallic ring 3 insert molded in the cover 2, a plurality of electrical contacts (not shown), a metallic cam actuator 4, and a washer 5.

The base 1 is generally in the shape of a square and comprises a plurality of passageways 12 extending therethrough and a flange 11 located at a corner thereof. The electrical contacts of the socket connector are received in the passageways 12, and the flange 11 defines an elongated square hole 13 therein.

The cover 2 has a shape corresponding to that of the base 1 and comprises a plurality of passages 23 extending therethrough and a flange 21 corresponding to the flange 11 of the base 1. The flange 21 defines an aperture 22 therethrough. The aperture 22 is generally circular in shape. A stop wall 24 is formed beside the aperture 22 and defines a pair of cover stop surfaces 25 on opposite sides of the aperture 22.

The cam actuator 4 comprises an upper disk 40, a lower disk 43 and a lower cam block 44. The upper disk 40 is coaxial with the lower disk 43 and has a diameter larger than the lower disk 43. The upper disk 40 defines an elongated groove 42 recessed from an upper surface thereof and forms a lateral protrusion 41 protruding from a lateral side (not labeled) thereof. The elongated groove 42 has two closed opposing longitudinal ends. Thus, a tool can be confinedly fitted into the groove 42 to exert a rotation force on the cam actuator 4, without the possibility that the tool may slide along the groove 42 beyond the periphery of the upper surface of the upper disk 40. The cam block 44 is formed under the lower disk 43 and comprises a riveting end 45 at a lower side thereof. A rotation axis of the cam block 44 is offset from a rotation axis of the lower disk 43.

Referring now to FIGS. 3 to 6, the metallic ring 3 in accordance with a first embodiment of the present invention comprises a bottom portion 33, a support portion 30 and an upper circular stop wall 31. The metallic ring 3 further defines a pair of symmetrically arranged cutouts 32 therein oriented in a vertical direction for allowing a flow of plastic material during insert molding thereinto. Although the metallic ring 3 includes a smooth, annular surface for engaging with the cam actuator, the outer contours of the ring 3 are very angular, due the cutouts 32, which helps in establishing a firm connection between the ring 3 and the cover 2 after insert molding of the ring 3 into the cover 2, and thus enhances the retention between the cover 2 and the ring 3. The circular stop wall 31 defines a pair of ring stop surfaces 34 on opposite ends thereof. The ring stop surfaces 34 are in line with the cover stop surfaces 25 when the ring 3 is assembled with the cover 2.

Referring now to FIGS. 7 to 11, a metallic ring 3' according to a second embodiment of the present invention comprises a support portion 30', an upper circular stop wall 31', and a bottom portion 33'. A pair of upper slots 32' is defined vertically through a periphery of the support portion 30', wherein one of the slots 32' further extends vertically through the circular stop wall 31'. The bottom portion 33' defines a pair of lower slots 34' vertically therethrough, the two lower slots 34' being arranged along a line perpendicular to a line joining the upper slots 32'. The stop wall 31' defines a pair of ring stop surfaces 35' on opposite ends thereof.

In assembly, the ring 3/3' is insert molded into the cover 2, the cover 2 is slidably mounted on the base 1 and the cam actuator 4 is inserted into the ring 3/3'. The lower disk 43 is received in a passage (not labeled) of the ring 3/3' and the upper disk 40 is supported by the support portion 30/30' of the ring 3/3'. The cam block 44 of the cam actuator 4 extends through the elongated square hole 13 of the base 1 and the riveting end 45 is riveted using the washer 5 (see FIG. 1) on a lower surface of the base 1, whereby the cam actuator 4, the cover 2, the base 1, and the washer 5 are assembled together. The washer 5 is made of a metallic or other suitable material.

In operation, after a PGA chip (not shown) is loaded on the cover 2, the external tool (not shown) is fitted into the groove 42 to rotate the cam actuator 4 until the lateral protrusion 41 engages with one of the flushed stop surfaces comprised of a cover stop surface 25 flush with a ring stop surface 34/35'. Since the axis of the cam block 44 is offset from the axis of the upper disk 40, the rotation of the cam actuator 4 forces the cover 2 to slide along the base 1 in a diagonal direction, thereby making the pins (not shown) of the PGA chip engage with the contacts (not shown) in the passageways 12. To open the pin-socket contacts connection, the cam actuator 4 is rotated in an opposite direction from the one flushed stop surfaces 25, 34 to the other flushed stop surfaces 25, 34 thereby disengaging the pins of the chip from the contacts of the socket and allowing the chip to be removed from the cover 2.

The ring 3/3' is made of a metallic material, giving it a longer life than the prior art plastic ring, and in turn giving the electrical socket a longer life. The metallic ring 3/3' has angular outer contours and is insert molded in the cover 2, so the connection between the ring 3/3' and the cover 2 is reliable. Additionally, the cutouts 32 and the slots 32', 34' permit a flow of plastic during insert molding, thereby preventing a rotational movement of the ring relative to the cover and enhancing the retention between the ring 3/3' and the cover 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket comprising:

a base comprising a plurality of passageways extending vertically therethrough for receiving a corresponding number of electrical contacts therein and a flange located at a corner thereof, the flange comprising a hole therethrough;

a cover slidably mounted on the base, the cover comprising a plurality of passages therethrough in alignment with the passageways of the base, respectively, and a flange positioned over the flange of the base, the flange defining an aperture in alignment with the hole of the base and a stop wall formed beside the aperture; and an actuation means comprising a metallic ring insert molded in the aperture of the cover and a cam actuator rotatably retained in the ring and extending into the hole of the base for actuating the cover to slide on the base, the metallic ring defining an angular outer contour to facilitate retention in the aperture;

wherein the metallic ring comprises an upper stop wall, a support portion, and a bottom portion;

wherein the metallic ring comprises a pair of cutouts oriented vertically therethrough for preventing a rotational movement of the ring relative to the cover;

wherein the metallic ring defines a pair of upper slots extending vertically through the upper stop wall and the support portion and a pair of lower slots extending vertically through the bottom portion, the lower slots being disposed in a line perpendicular to a line joining the upper slots;

wherein the upper stop wall of the metallic ring defines a pair of ring stop surfaces on opposite ends thereof, and the stop wall of the cover defines a pair of cover stop surfaces which, in assembly, lie flush with the ring stop surfaces of the metallic ring;

wherein the cam actuator comprises a lower disk received in the ring, an upper disk supported by the support portion of the ring, and a cam block received in the hole of the base;

wherein the upper disk of the cam actuator forms an elongated groove in ta top surface thereof adapted for being operated by an external tool;

wherein the upper disk contains a lateral protrusion engageable with the flush cover stop surfaces and ring stop surfaces;

wherein the actuation mechanism comprises a washer, and the cam block comprises a riveting end for riveting the washer to the cam block;

wherein the elongated groove is closed-ended.

* * * * *